(12) United States Patent
Chiu

(10) Patent No.: US 10,580,744 B1
(45) Date of Patent: Mar. 3, 2020

(54) SEMICONDUCTOR DEVICE

(71) Applicant: NANYA TECHNOLOGY CORPORATION, New Taipei (TW)

(72) Inventor: Hsih-Yang Chiu, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 16/137,250

(22) Filed: Sep. 20, 2018

(51) Int. Cl.
*H01L 23/52* (2006.01)
*H01L 23/58* (2006.01)

(52) U.S. Cl.
CPC .................................. *H01L 23/585* (2013.01)

(58) Field of Classification Search
CPC ........................................................ H01L 23/52
USPC .......................................................... 257/774
See application file for complete search history.

(56) References Cited

U.S. PATENT DOCUMENTS

| | | | |
|---|---|---|---|
| 4,893,759 A | 1/1990 | Mizobata | |
| 5,831,330 A * | 11/1998 | Chang | H01L 23/585 257/620 |
| 6,492,716 B1 * | 12/2002 | Bothra | H01L 23/552 257/678 |
| 6,537,849 B1 * | 3/2003 | Tsai | H01L 23/552 257/E23.114 |
| 6,998,712 B2 * | 2/2006 | Okada | H01L 22/32 257/758 |
| 7,550,850 B2 * | 6/2009 | Nakashiba | H01L 21/823878 257/508 |
| 8,242,586 B2 * | 8/2012 | Chang | H01L 23/5225 257/501 |
| 8,373,254 B2 * | 2/2013 | Chen | H01L 23/585 257/620 |
| 2014/0145301 A1 | 5/2014 | Moghe et al. | |
| 2017/0179044 A1 | 6/2017 | Hsu et al. | |

FOREIGN PATENT DOCUMENTS

WO    WO 2009/145907 A1    12/2009

* cited by examiner

*Primary Examiner* — Luan C Thai
(74) *Attorney, Agent, or Firm* — Muncy, Geissler, Olds & Lowe, P.C.

(57) ABSTRACT

The present disclosure provides a semiconductor device. The semiconductor device includes a semiconductor substrate, a die and a seal ring. The die is configured to be in and on the semiconductor substrate. The seal ring is configured to be on the semiconductor substrate and adjacent to the die. The seal ring forms an open loop.

20 Claims, 17 Drawing Sheets

SEMICONDUCTOR DEVICE

TECHNICAL FIELD

The present disclosure relates to a semiconductor device, and more particularly, to a semiconductor device including a seal ring.

DISCUSSION OF THE BACKGROUND

Seal ring formation is an important part in the back-end of the semiconductor manufacturing process. Seal rings are stress protection structures around integrated circuits, and protect internal circuitry of semiconductor chips from damage caused by the dicing of wafers into semiconductor chips.

This Discussion of the Background section is for background information only. The statements in this Discussion of the Background are not an admission that the subject matter disclosed in this section constitutes a prior art to the present disclosure, and no part of this section may be used as an admission that any part of this application, including this Discussion of the Background section, constitutes prior art to the present disclosure.

SUMMARY

One aspect of the present disclosure provides a semiconductor device. The semiconductor device includes a semiconductor substrate, a die and a seal ring. The die is configured to be in and on the semiconductor substrate. The seal ring is configured to be on the semiconductor substrate and to be adjacent to the die. The seal ring forms an open loop.

In some embodiments, the seal ring includes a first conductive layer and a second conductive layer. The first conductive layer includes an opening therein. The second conductive layer, over the first conductive layer, includes an opening therein. The opening of the second conductive layer exposes the opening of the first conductive layer.

In some embodiments, the first conductive layer is in contact with the semiconductor substrate.

In some embodiments, the semiconductor device further includes a dielectric layer. The dielectric layer is in contact with the semiconductor substrate. The first conductive layer is on the dielectric layer, and electrically isolated from the semiconductor substrate by the dielectric layer.

In some embodiments, the first conductive layer and the second conductive layer in combination form an open loop.

In some embodiments, the seal ring includes a first conductive layer and a second conductive layer. The first conductive layer includes an opening therein. The second conductive layer, over the first conductive layer, includes an opening therein. The opening of the second conductive layer exposes a portion of the first conductive layer, and the second conductive layer overlaps the opening of the first conductive layer.

In some embodiments, the seal ring includes a first conductive layer and a second conductive layer. The first conductive layer includes a first segment and a second segment. The second conductive layer includes a first segment configured to be grouped with the first segment of the first conductive layer as a first group, and a second segment configured to be grouped with the second segment of the first conductive layer as a second group. The first group is electrically isolated from and physically independent of the second group.

In some embodiments, the first segment of the first conductive layer is coupled to the first segment of the second conductive layer, and the second segment of the first conductive layer is coupled to the second segment of the second conductive layer.

In some embodiments, the seal ring includes a first conductive layer, a second conductive layer, a first via and a second via. The first conductive layer includes a first segment, and a second segment separate from the first segment. The second conductive layer is over the first conductive layer. The first via is configured to connect the first segment to the second conductive layer. The second via is configured to connect the second conductive layer to the second segment.

Another aspect of the present disclosure provides a semiconductor device. The semiconductor device includes a semiconductor substrate, a die and a seal ring. The die is configured to be in and on the semiconductor substrate, and to transmit a signal. The seal ring is configured to be on the semiconductor substrate, and adjacent to the die. The seal ring is insensitive to a change in magnetic flux, caused by the signal, through the seal ring.

In some embodiments, the seal ring includes a first seal ring in a first conductive layer, and a second seal ring in a second conductive layer. The first seal ring is coupled to the second seal ring. The first seal ring and the second seal ring in combination are insensitive to the change in magnetic flux.

In some embodiments, the first conductive layer serves as an etching-stop layer.

In the present disclosure, the seal ring, which is a seal ring closest to the die, forms an open loop. Consequently, the seal ring is insensitive to a change in magnetic flux, caused by a signal transmitted by the seal ring, through the seal ring. No induced current is generated. As a result, issues caused by induced current are alleviated or eliminated.

The foregoing has outlined rather broadly the features and technical advantages of the present disclosure in order that the detailed description of the disclosure that follows may be better understood. Additional features and technical advantages of the disclosure are described hereinafter, and form the subject of the claims of the disclosure. It should be appreciated by those skilled in the art that the concepts and specific embodiments disclosed may be utilized as a basis for modifying or designing other structures, or processes, for carrying out the purposes of the present disclosure. It should also be realized by those skilled in the art that such equivalent constructions do not depart from the spirit or scope of the disclosure as set forth in the appended claims.

BRIEF DESCRIPTION OF THE DRAWINGS

A more complete understanding of the present disclosure may be derived by referring to the detailed description and claims. The disclosure should be understood to be connected to the figures' reference numbers, which refer to similar elements throughout the description.

DETAILED DESCRIPTION

Figure 1:
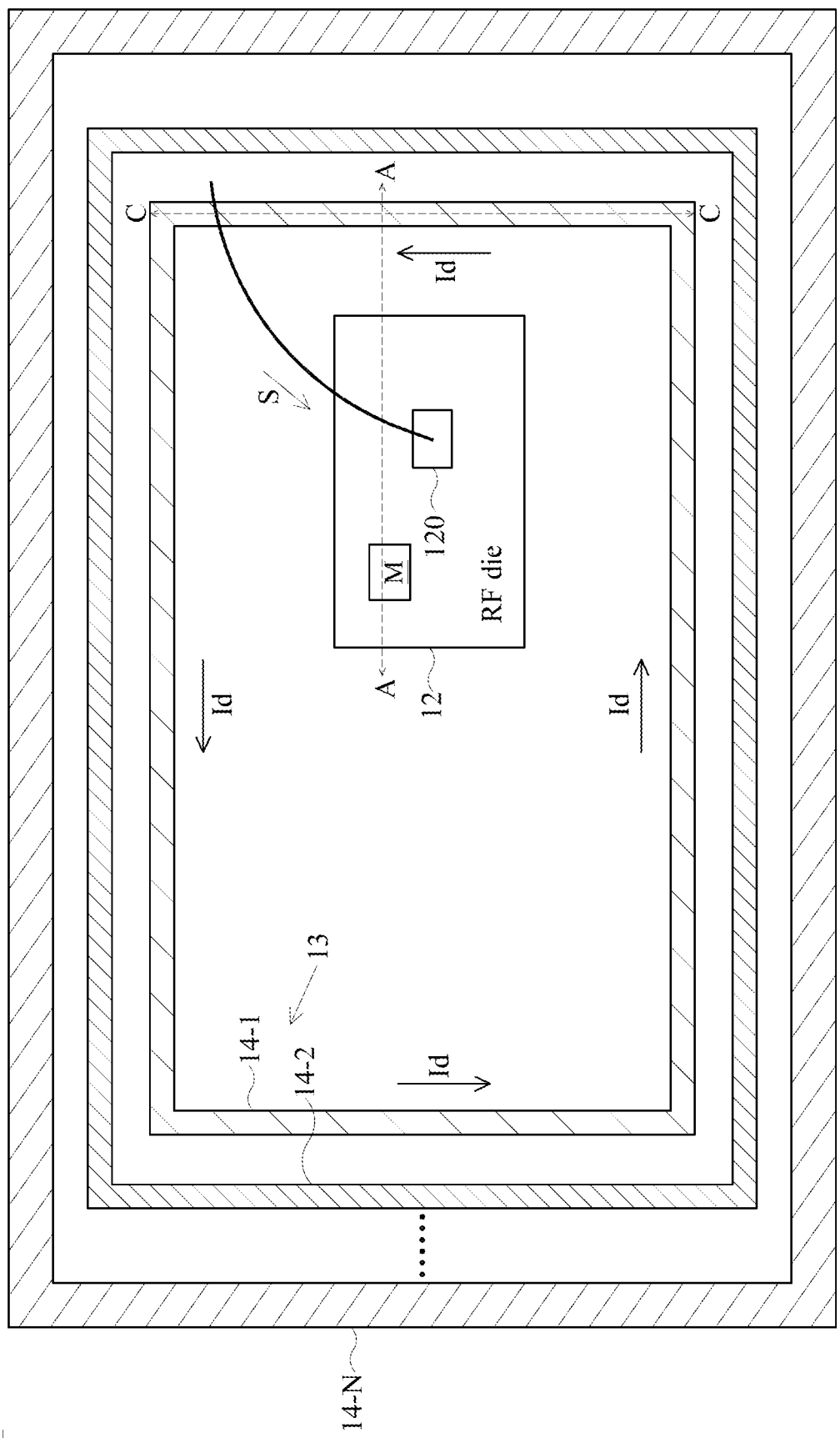
FIG. 1 is a schematic layout view of a comparative semiconductor device.

Embodiments of the disclosure are discussed in detail below. It should be appreciated, however, that the embodiments provide many applicable inventive concepts that can be embodied in a wide variety of specific contexts. The specific embodiments discussed are merely illustrative of specific ways to make and use the embodiments, and do not limit the scope of the disclosure.

Throughout the various views and illustrative embodiments, like reference numerals are used to designate like elements. Reference will now be made in detail to exemplary embodiments illustrated in the accompanying drawings. Wherever possible, the same reference numbers are used in the drawings and the description to refer to the same or like parts. In the drawings, the shape and thickness may be exaggerated for clarity and convenience. This description will be directed in particular to elements forming part of, or cooperating more directly with, an apparatus in accordance with the present disclosure. It should be understood that elements not specifically shown or described may take various forms. Reference throughout this specification to "some embodiments" or "an embodiment" means that a particular feature, structure, or characteristic described in connection with the embodiment is included in at least one embodiment. Thus, the appearances of the phrases "in some embodiments" or "in an embodiment" in various places throughout this specification do not necessarily refer to the same embodiment. Furthermore, the particular features, structures, or characteristics may be combined in any suitable manner in one or more embodiments.

In the drawings, like reference numbers are used to designate like or similar elements throughout the various views, and illustrative embodiments of the present invention are shown and described. The figures are not necessarily drawn to scale, and in some instances the drawings have been exaggerated and/or simplified in places for illustrative purposes only. A person having ordinary skill in the art will appreciate the many possible applications and variations of the present invention based on the following illustrative embodiments of the present invention.

Unless otherwise defined, all terms (including technical and scientific terms) used herein have the same meaning as commonly understood by a person having ordinary skill in the art to which the embodiments of the present disclosure belong. It should be further understood that terms, such as those defined in commonly used dictionaries, should be interpreted as having a meaning that is consistent with their meaning in the context of the relevant art and the present disclosure, and should not be interpreted in an idealized or overly formal sense unless expressly so defined herein.

FIG. 1 is a schematic layout view of a comparative semiconductor device 10. Referring to FIG. 1, the semiconductor device 10 includes a radio frequency (RF) die 12, and a seal ring structure 13 including a plurality of seal rings 14 (for example, 14-1, 14-2, ..., 14-N, wherein N is a positive integer).

The RF die 12 transmits an RF signal S. The RF die 12 includes a transistor M. In one or more embodiments, the transistor M includes a power field-effect transistor (FET), such as a double-diffused metal-oxide-semiconductor (DMOS) transistor. In other embodiments, the transistor M includes another suitable device, such as an insulated-gate bipolar transistor (IGBT), a field effect transistor (FET), or other suitable device. In some embodiments, the transistor M includes an n-type metal-oxide-semiconductor (NMOS) field-effect transistor. In some embodiments, the transistor M includes a p-type metal-oxide-semiconductor (PMOS) field-effect transistor.

The seal ring 14 functions to protect the RF die 12 from, for example, stress applied to the semiconductor device 10, thereby avoiding damage to the RF die 12. The stress is caused during the dicing of the semiconductor device 10 from a wafer including the semiconductor device 10.

In operation, the RF die 12 receives, for example, the RF signal S via a pad 120 on the RF die 12. According to Lenz's law, for most of the plurality of seal rings 14, an induced current Id is generated in response to a change in magnetic flux, caused by the RF signal S, through the seal rings 14. Although most of the plurality of seal rings 14 may conduct the induced current Id, apart from the seal ring 14-1, which is closest and immediately adjacent to the RF die 12, the rest of the seal rings 14 are positioned relatively away from the RF die 12. Accordingly, the induced current Id on the rest of the seal rings 14 does not significantly affect the RF die 12, and the effect of the induced current Id on the rest of the seal rings 14 is negligible.

Because the RF signal S is a relatively high frequency signal, a level of the change in magnetic flux is therefore significant and a magnitude of the induced current Id is relatively great. The relatively great current Id conducted through the closest seal ring 14-1 may damage the RF die 12, causing the RF die 12 to function abnormally, as will be described in detail with reference to FIG. 2.

Figure 2:
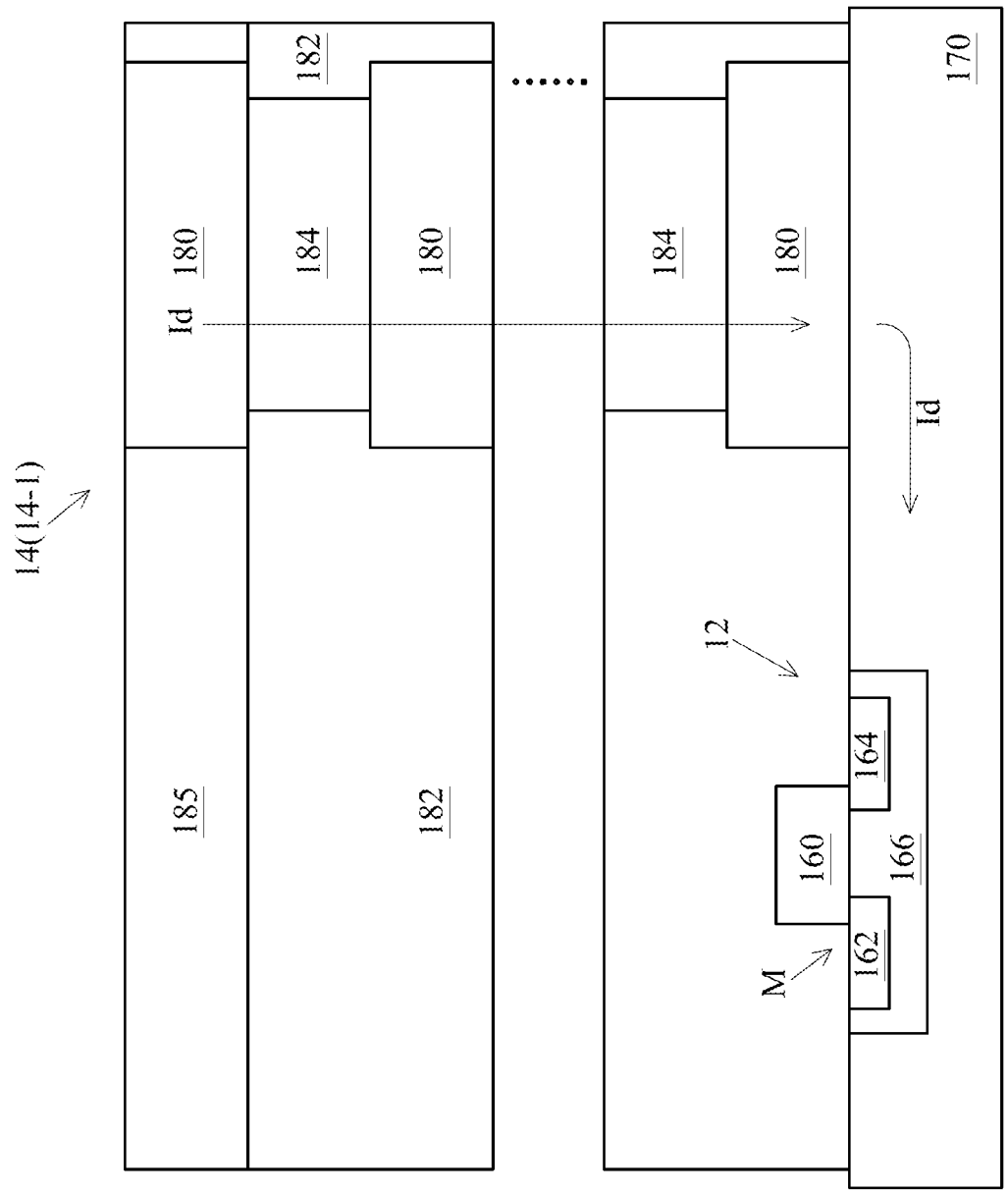
FIG. 2 is a cross-sectional view of the comparative semiconductor device shown in FIG. 1 taken along a line A-A.

FIG. 2 is a cross-sectional view of the comparative semiconductor device 10 shown in FIG. 1 taken along a line A-A. Referring to FIG. 2, the semiconductor device 12 includes a semiconductor substrate 170, on which the seal ring 14 is to be disposed. The seal ring 14 includes interconnected metal components, which are formed of metal layers 180 and conductive vias 184, both formed in dielectric layers 182 except the top metal layer 180. The top metal layer 180 is formed in a dielectric layer 185.

The transistor M includes a gate 160, a source region 162 in a well 166 in the substrate 170, and a drain region 164. The die 12 is configured to be in and on the semiconductor substrate 170.

Once the induced current Id is generated, the induced current Id flows from the top metal layer 180 through the bottom metal layer 180 to the substrate 170. Subsequently, the induced current Id may flow toward the RF die 12, in particular, the transistor M. Because of the induced current Id, for example, operation of the transistor M may be disturbed, causing the RF die 12 to function abnormally.

Figure 3:
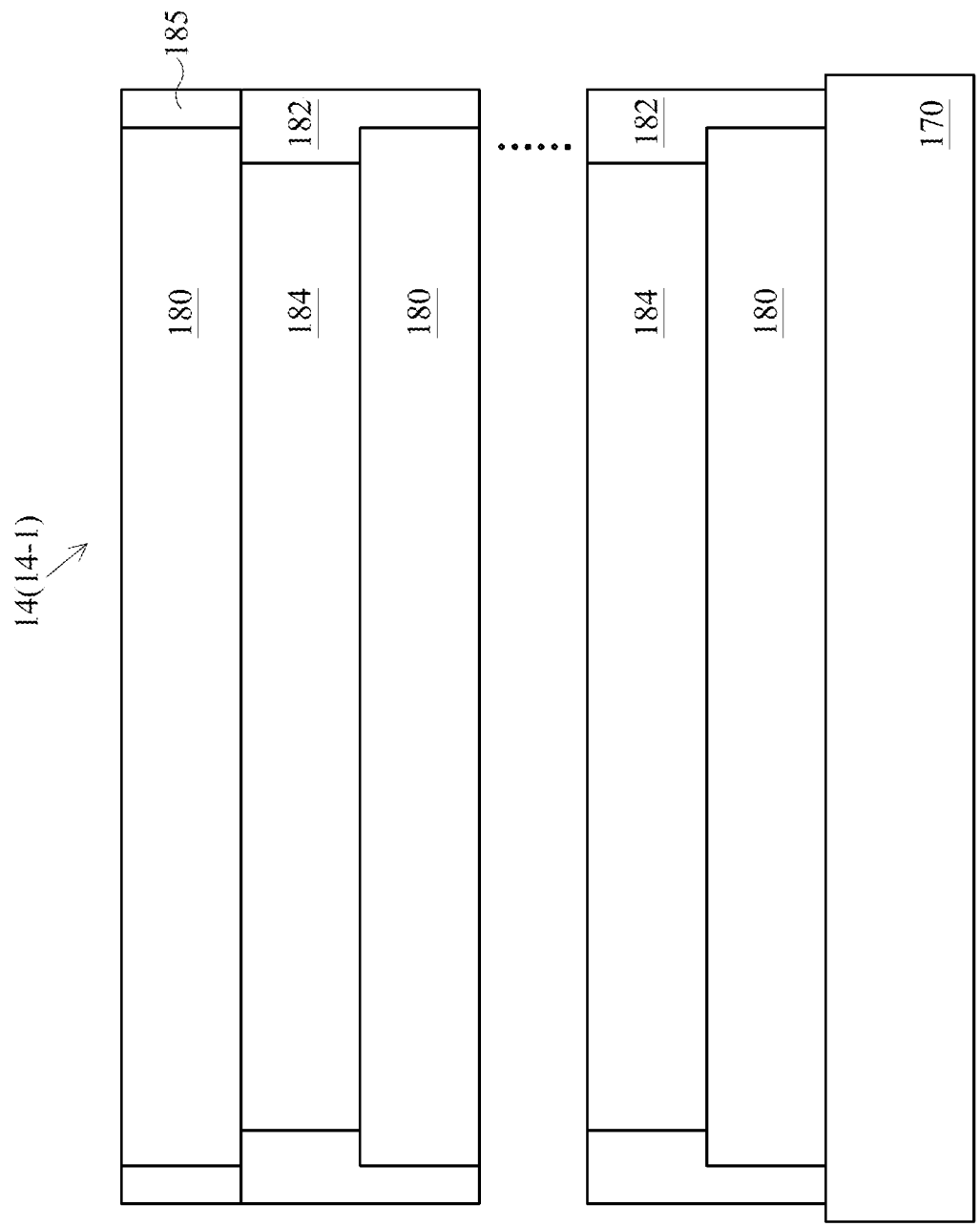
FIG. 3 is a cross-sectional diagram of the comparative semiconductor device shown in FIG. 1 taken along a line C-C.

FIG. 3 is a cross-sectional diagram of the comparative semiconductor device 10 shown in FIG. 1 taken along a line C-C. Referring to FIG. 3, the conductive via 184 takes the form of a trench, instead of a plug, to effectively protect the RF die 12 from the stress during the dicing.

Figure 4:
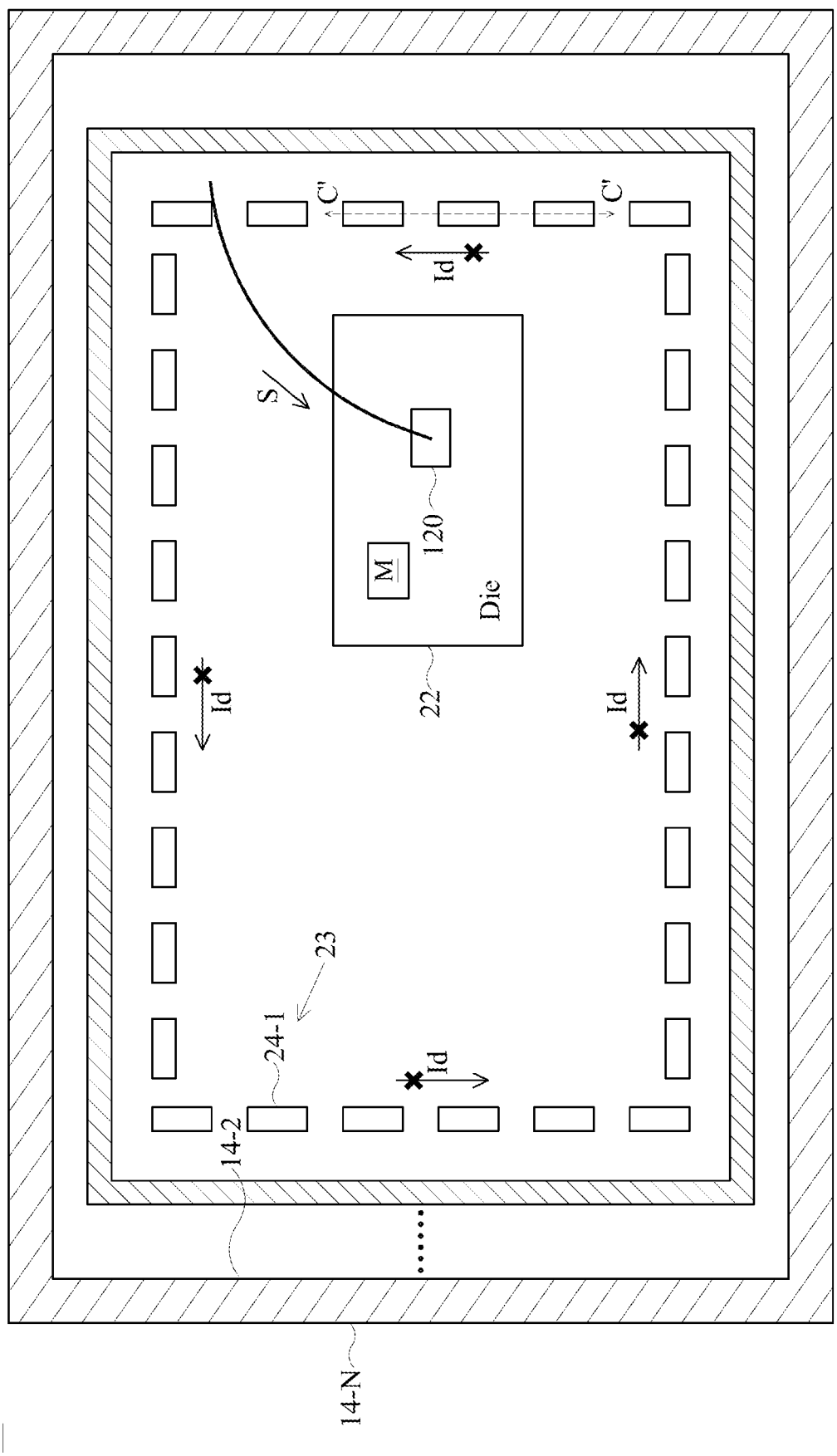
FIG. 4 is a schematic layout view of an exemplary semiconductor device, in accordance with some embodiments of the present disclosure.

FIG. 4 is a schematic layout view of an exemplary semiconductor device 20, in accordance with some embodiments of the present disclosure. The semiconductor device 20 is similar to the semiconductor device 10 described and illustrated with reference to FIG. 1 except that, for example, the semiconductor device 20 includes a die 22 and a seal ring structure 23. The die 22 includes, for example, an RF die. In some implementations, the die 22 may include logic dies (e.g., central processing unit or microcontroller), memory dies (e.g., static random access memory (SRAM) die), power management dies (e.g., power management integrated circuit (PMIC) die), radio frequency (RF) dies, sensor dies, micro-electro-mechanical-system (MEMS) dies, signal processing dies (e.g., digital signal processing (DSP) die), front-end dies (e.g., analog front-end (AFE) dies), or a combination thereof. The die 22 includes any type of die whose operation frequency is relatively high.

The seal ring structure 15 is similar to the seal ring structure 13 described and illustrated with reference to FIG. 1 except that, for example, a seal ring 24-1, which is a seal ring closer to the die 22 than the seal rings 14-2 to 14-N. The seal ring 24-1 is immediately adjacent to the die 22.

The seal ring 24-1 is divided into a plurality of segments, such that the seal ring 24-1 forms an open loop. Consequently, the seal ring 24-1 is insensitive to a change in magnetic flux, caused by a signal transmitted by the die 22, through the seal ring 24-1. No induced current is generated. Issues caused by an induced current, as discussed in the description of the comparative semiconductor device 1 shown in FIG. 1, are alleviated or eliminated. In some embodiments, the semiconductor device 2 includes two or more seal rings, which are similar to the seal ring 24-1 in structure.

Figure 5:
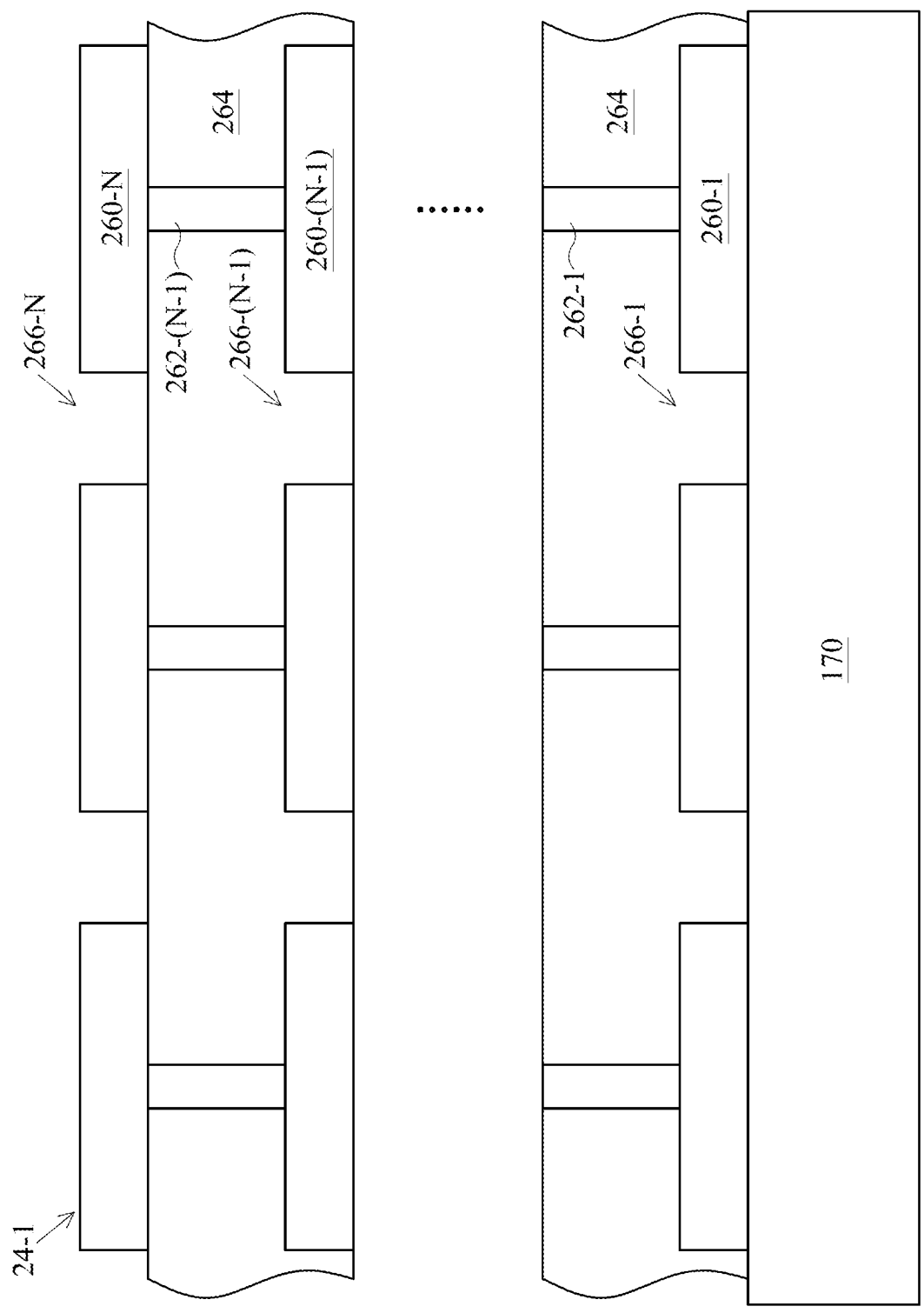
FIG. 5 is a cross-sectional view of the exemplary semiconductor device shown in FIG. 4 taken along a line C'-C', in accordance with some embodiments of the present disclosure.

FIG. 5 is a cross-sectional view of the exemplary semiconductor device 20 shown in FIG. 4 taken along a line C'-C', in accordance with some embodiments of the present disclosure. Referring to FIG. 5, a plurality of conductive vias 262 (for example, 262-1, . . . , 262-N, wherein N is a positive integer) and a plurality of conductive layers 260 (for example, 260-1, . . . , 260-N, wherein N is a positive integer), are formed on the substrate 170, and in a dielectric layer 264 apart from the conductive layer 260-N. The conductive via 262 functions to connect one of two neighboring conductive layers 260 to the other of the two neighboring conductive layers 260.

Each of the conductive layers 260 is divided into a plurality of segments. As previously discussed, each of the conductive layers 260 forms an open loop, and therefore the each of the conductive layers 260 is insensitive to a change in magnetic flux, caused by a signal transmitted by the die 22, through the seal ring 24-1. For the each of the conductive layers 260, no induced current Id is generated. Issues caused by an induced current are alleviated or eliminated.

No induced current is generated on the seal ring 24-1. Therefore, in the present embodiment, even though the conductive layer 260-1 is in contact with the semiconductor substrate 170, there is no need to consider a circumstance in which an induced current flows into the semiconductor substrate 170 and causes the die 22 to function abnormally.

For convenience of discussion, the conductive layer 260-(N-1) is renamed as a first conductive layer 260-(N-1), and the conductive layer 260-N immediately over the conductive layer 260-(N-1) is renamed as a second conductive layer 260-N.

The first conductive layer 260-(N-1) includes an opening 266-(N-1) therein. The second conductive layer 260-N includes an opening 266-N therein. In some embodiments, the opening 266-N of the second conductive layer 260-N exposes the opening 266-(N-1) of the first conductive layer 260-(N-1). In some embodiments, the opening 266-N of the second conductive layer 260-N exposes a portion of the opening 266-(N-1) of the first conductive layer 260-(N-1), and a portion of a segment of the first conductive layer 260-(N-1). The opening 266-N is not perfectly aligned to the opening 266-(N-1).

Figure 6:
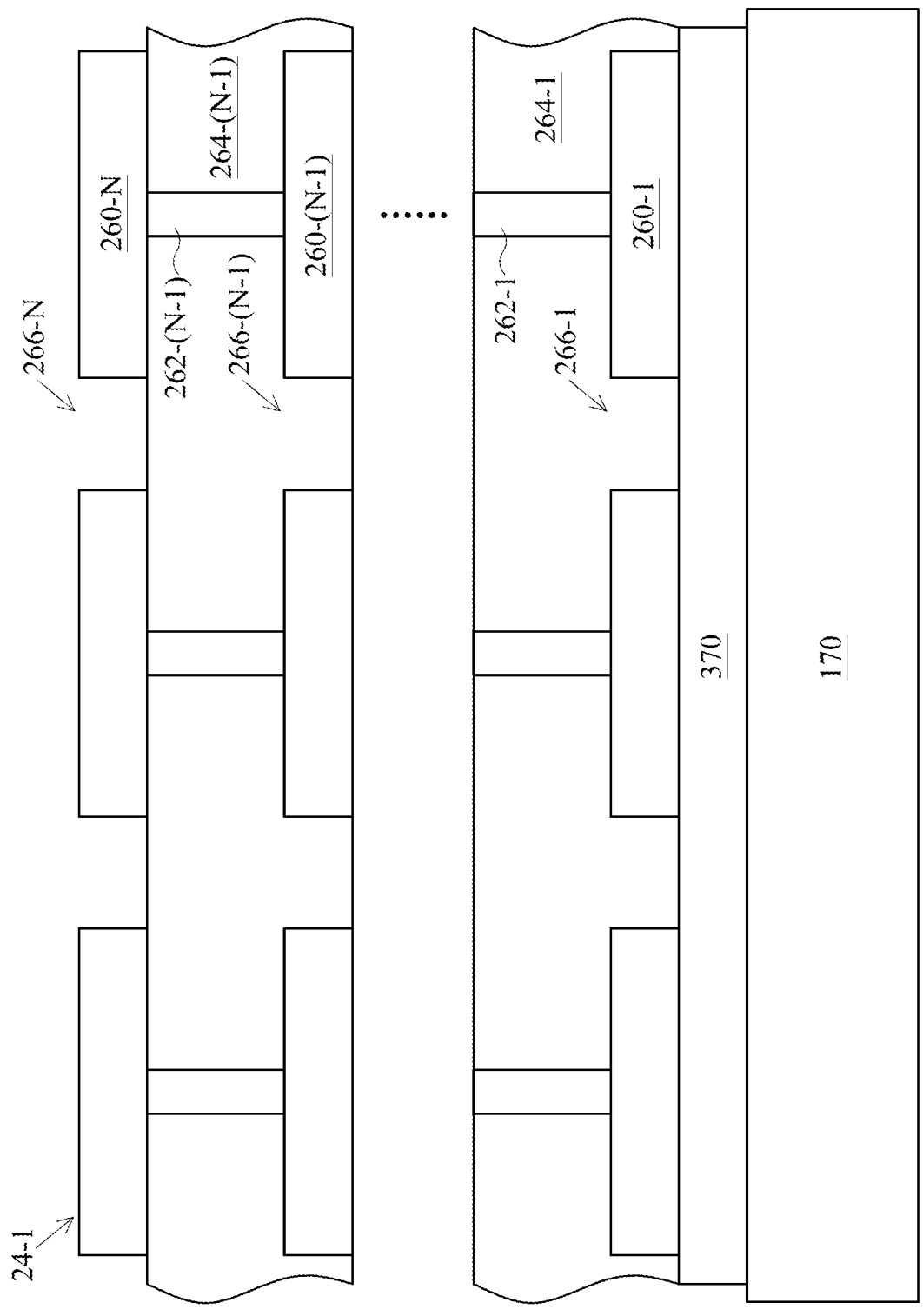
FIG. 6 is a cross-sectional diagram of another exemplary semiconductor device, in accordance with some embodiments of the present disclosure.

FIG. 6 is a cross-sectional diagram of another exemplary semiconductor device 30, in accordance with some embodiments of the present disclosure. Referring to FIG. 6, the semiconductor device 30 is similar to the semiconductor device 20 described and illustrated with reference to FIG. 5 except that, for example, the semiconductor device 30 further includes a dielectric layer 370, on which the conductive layer 260-1 is disposed, wherein the dielectric layer 370 is in contact with the semiconductor substrate 170.

The dielectric layer 370 functions to electrically isolate the seal ring 24-1 from the semiconductor substrate 170. In such case, even if an induced current is generated, such induced current is blocked by the dielectric layer 370 and is unable to flow into the semiconductor substrate 170 and disturb operation of the die 22.

Figure 7:
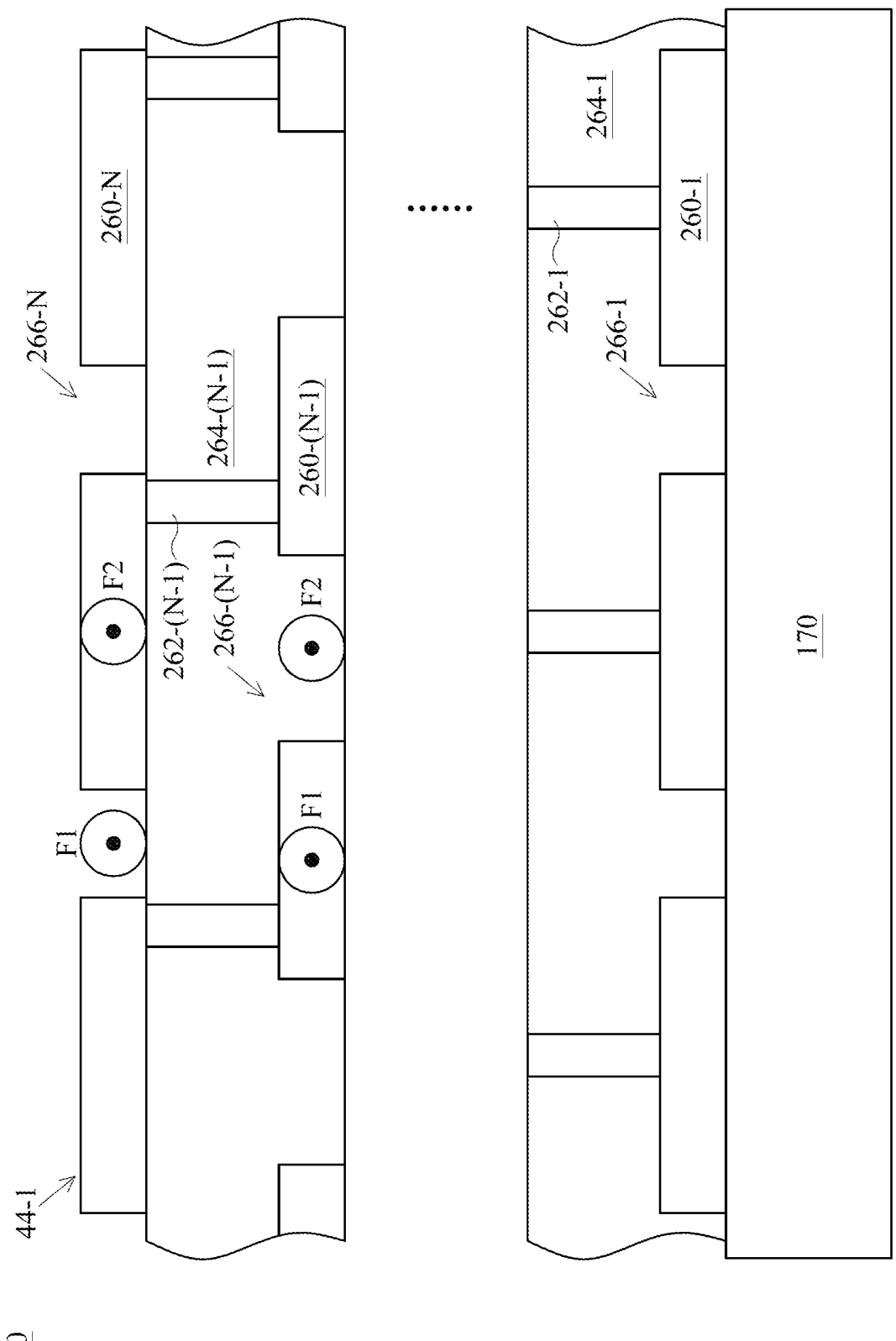
FIG. 7 is a cross-sectional diagram of yet another exemplary semiconductor device, in accordance with some embodiments of the present disclosure.

FIG. 7 is a cross-sectional diagram of another exemplary semiconductor device 40, in accordance with some embodiments of the present disclosure. Referring to FIG. 7, the semiconductor device 40 is similar to the semiconductor device 20 described and illustrated with reference to FIG. 5 except that, for example, the semiconductor device 40 includes a seal ring 44-1 with alternating openings in neighboring conductive layers.

For example, the opening 266-N of the second conductive layer 260-N and the opening 266-(N-1) of the first conductive layer 260-(N-1) are alternately arranged. The opening 266-N of the second conductive layer 260-N exposes a portion of a segment of the first conductive layer 260-(N-1), and the second conductive layer 260-N overlaps the opening 266-(N-1) of the first conductive layer 260-(N-1). With such configuration, the semiconductor device 40 has a relatively good resistance to the stress incurred during the dicing. In further detail, it is assumed that a stress F1 is applied to the semiconductor device 40. The first conductive layer 260-(N-1) is able to resist a portion of the stress F1, wherein a path in which the stress F is transmitted passes through the first conductive layer 260-(N-1) and the opening 266-N. Alternatively, it is assumed that a stress F2 is applied to the semiconductor device 40. The second conductive layer 260-N is able to resist a portion of the stress F2, wherein a path in which the stress F2 is transmitted passes through the second conductive layer 260-N and the opening 266-(N−1). As a result, the staggered arrangement of openings increases an ability of the semiconductor device 40 to resist a stress.

Figure 8:
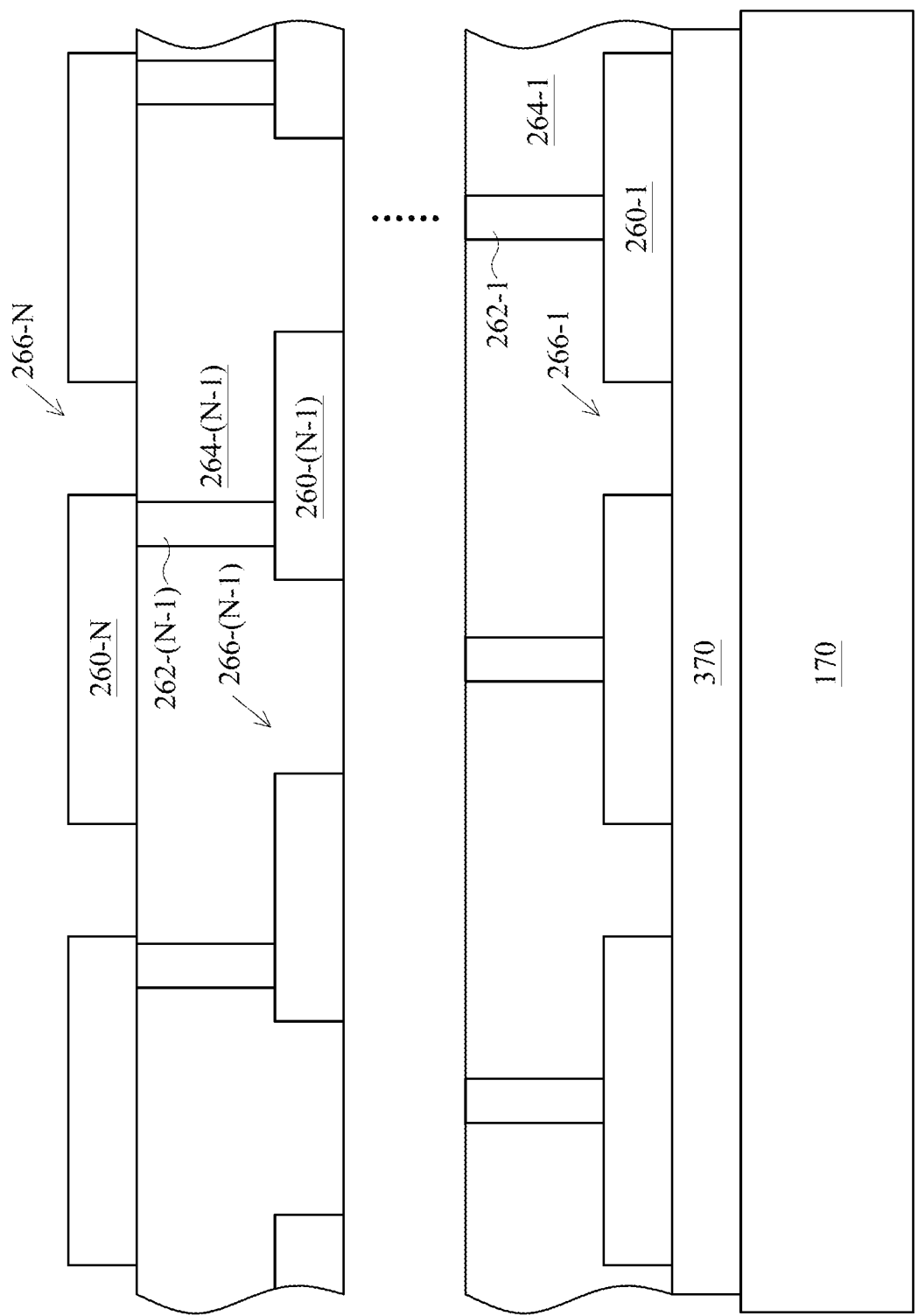
FIG. 8 is a cross-sectional diagram of still another exemplary semiconductor device, in accordance with some embodiments of the present disclosure.

FIG. 8 is a cross-sectional diagram of another exemplary semiconductor device 50, in accordance with some embodiments of the present disclosure. Referring to FIG. 8, the semiconductor device 50 is configured to include the dielectric layer 370 shown in FIG. 6 and the staggered arrangement of openings in different conductive layers shown in FIG. 7.

Figure 9:
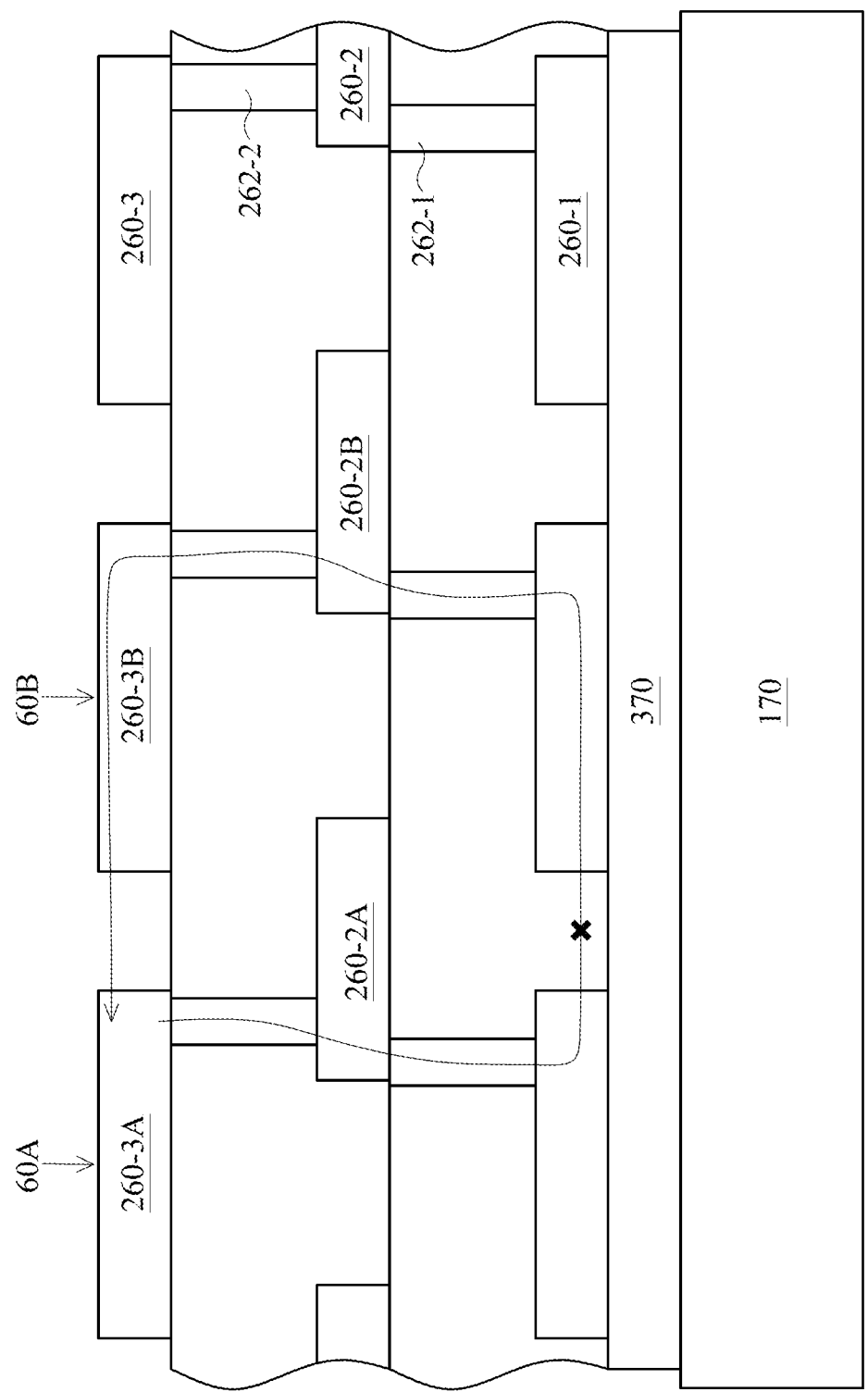
FIG. 9 is a cross-sectional diagram of yet another exemplary semiconductor device, in accordance with some embodiments of the present disclosure.

FIG. 9 is a cross-sectional diagram of another exemplary semiconductor device 60, in accordance with some embodiments of the present disclosure. Referring to FIG. 9, in the present embodiment, for convenience of discussion, it is assumed that N is 3.

The first conductive layer 260-2 includes a first segment 260-2A, and a second segment 260-2B separate from the first segment 260-2A.

The second conductive layer 260-3 includes a first segment 260-3A and a second segment 260-3B. The first segment 260-3A is coupled to the first segment 260-2A of the first conductive layer 260-2. In addition, the first segment 260-3A is configured to be grouped with the first segment 260-2A as a first group 60A. Similarly, the second segment 260-3B is coupled to the second segment 260-2B of the first conductive layer 260-2. In addition, the second segment 260-3B is configured to be grouped with the second segment 260-2B as a second group 60B.

The first group 60A is electrically isolated from and physically independent of the second group 60B. Therefore, when seen from a cross-sectional perspective, there is still no closed loop formed, and it is therefore assured that no induced current is generated. The first conductive layer 260-2 and the second conductive layer 260-3 in combination still form an open loop.

Figure 10:
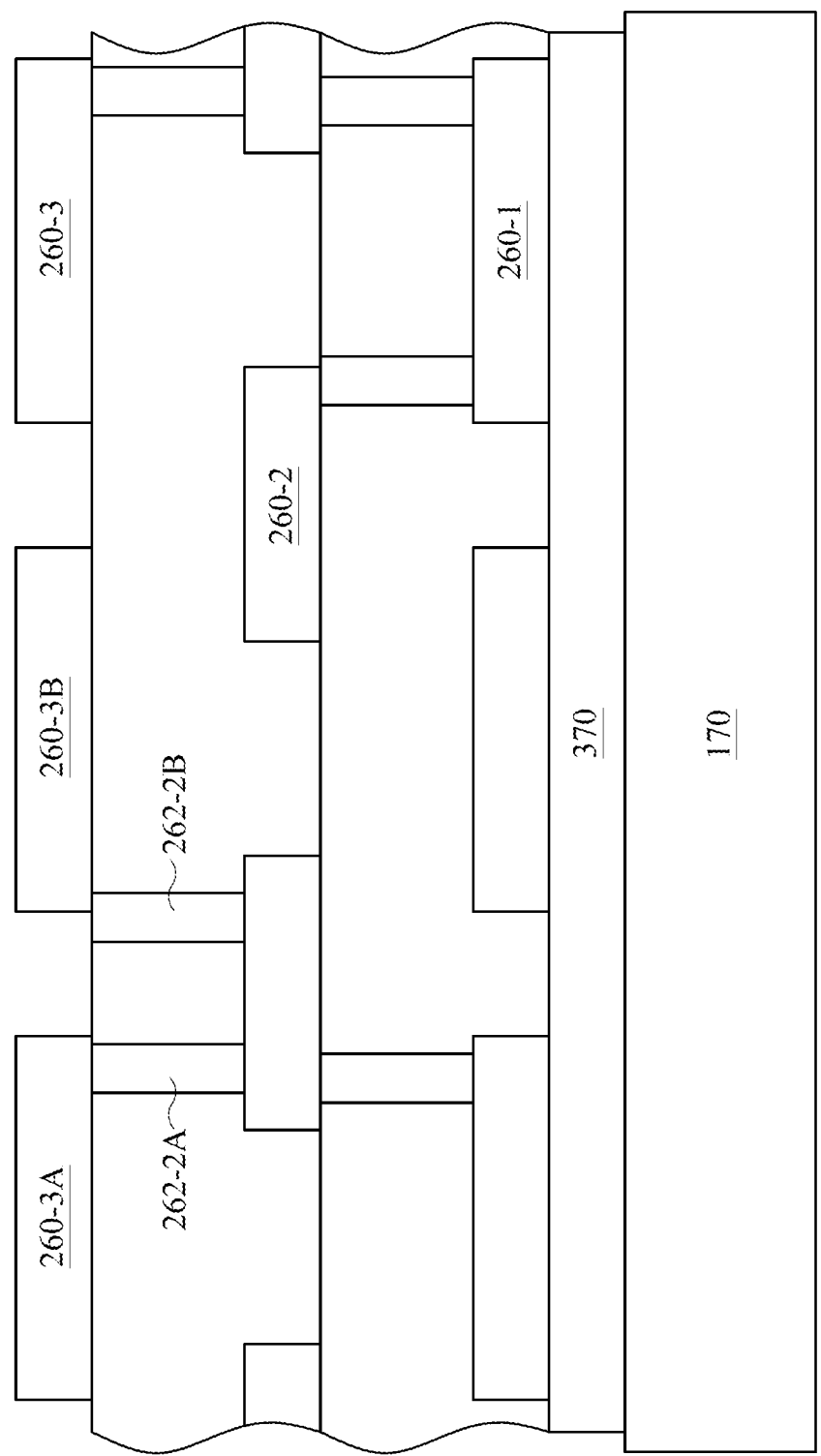
FIG. 10 is a cross-sectional diagram of another exemplary semiconductor device, in accordance with some embodiments of the present disclosure.

FIG. 10 is a cross-sectional diagram of yet another exemplary semiconductor device 70, in accordance with some embodiments of the present disclosure. Referring to FIG. 10, the first segment 260-3A is connected the first segment 260-2A of the first conductive layer 260-2 via a conductive via 262-2A. Moreover, the first segment 260-2A of the first conductive layer 260-2 is connected to the second segment 260-3B via a conductive via 262-2B. Although the conductive vias 262-2A and 262-2B are added, the first conductive layer 260-2 and the second conductive layer 260-3 still form an open loop. As a result, no induced current is generated.

FIGS. 11 to 17 are cross-sectional views illustrating intermediate steps during a process for forming a semiconductor device, in accordance with some embodiments of the present disclosure.

Figure 11:
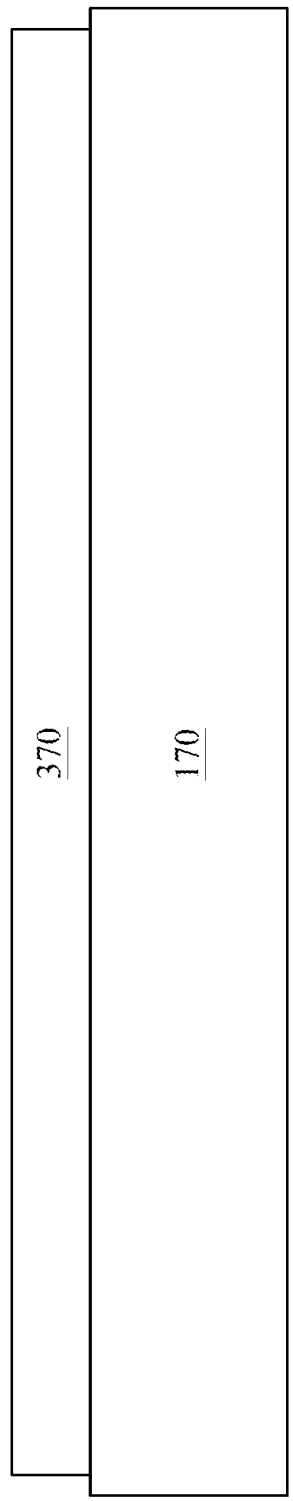
FIGS. 11 to 17 are cross-sectional views illustrating intermediate steps during a process for forming a semiconductor device, in accordance with some embodiments of the present disclosure.

Referring to FIG. 11, a semiconductor substrate 170 is received. In some embodiments, the substrate 170 includes a wafer over which devices such as semiconductor devices or other devices are to be formed. In some embodiments, the substrate 170 includes a semiconductor substrate, such as a bulk semiconductor substrate. The bulk semiconductor substrate includes an elementary semiconductor, such as silicon or germanium; a compound semiconductor, such as silicon germanium, silicon carbide, gallium arsenic, gallium phosphide, indium phosphide, or indium arsenide; or combinations thereof. In some embodiments, the substrate 170 includes a multilayered substrate, such as a silicon-on-insulator (SOI) substrate, which includes a bottom semiconductor layer, a buried oxide layer (BOX) and a top semiconductor layer. In some embodiments, the substrate 170 may be a p-type doped substrate, or an n-type doped substrate, which means that the semiconductor substrate 170 may be doped with either n-type or p-type impurities. The substrate 170 is formed from silicon, gallium arsenide, silicon germanium, silicon carbon, or other known semiconductor materials used in semiconductor device processing. Although a semiconductor substrate is used in the illustrated examples presented herein, in other alternative embodiments, epitaxially grown semiconductor materials or silicon on insulator (SOI) layers may be used as the substrate 170.

After the receipt of the semiconductor substrate 170, a dielectric layer 370 is formed thereon by any acceptable deposition process, such as spin coating, chemical vapor deposition (CVD), laminating, the like, or a combination thereof.

In some embodiments, the dielectric layer 370 may be formed of a polymer, which may also be a photosensitive material such as polybenzoxazole (PBO), polyimide, benzocyclobutene (BCB), or the like. In accordance with alternative embodiments of the present disclosure, the dielectric layer 370 is formed of an inorganic material(s), which may be a nitride such as silicon nitride, an oxide such as silicon oxide, PhosphoSilicate Glass (PSG), BoroSilicate Glass (BSG), Boron-doped PhosphoSilicate Glass (BPSG), or the like.

Figure 12:
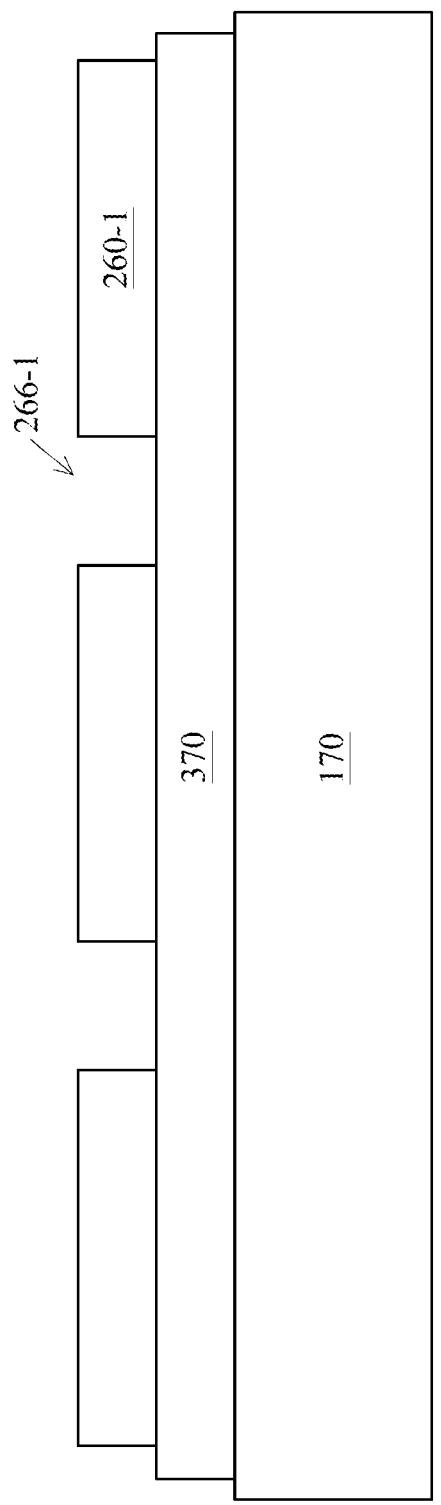

Referring to FIG. 12, the patterned conductive layer 260-1 having openings 266-1 is formed on the dielectric layer 370 by, for example, a formation of a seed layer, physical vapor deposition (PVD), photolithography processes, electroplating or electroless plating, ashing or stripping processes, wet or dry etching, or any other suitable processes. In some embodiments, the conductive layer 260-1 includes a poly layer. In some embodiments, the conductive layer 260-1 serves as an etching-stop layer.

Figure 13:
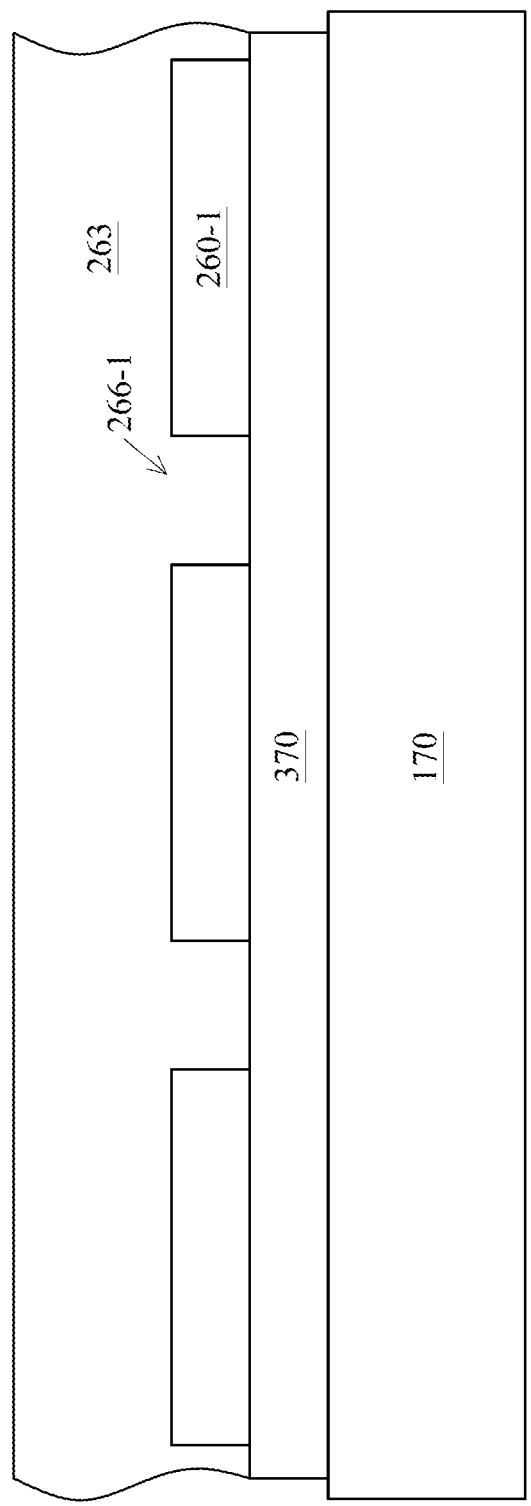

Referring to FIG. 13, the dielectric layer 263 is formed on the patterned conductive layer 260-1 and in the opening 266-1 of the patterned conductive layer 260-1 by, for example, any acceptable deposition process, such as spin coating, chemical vapor deposition (CVD), laminating, the like, or a combination thereof.

Figure 14:
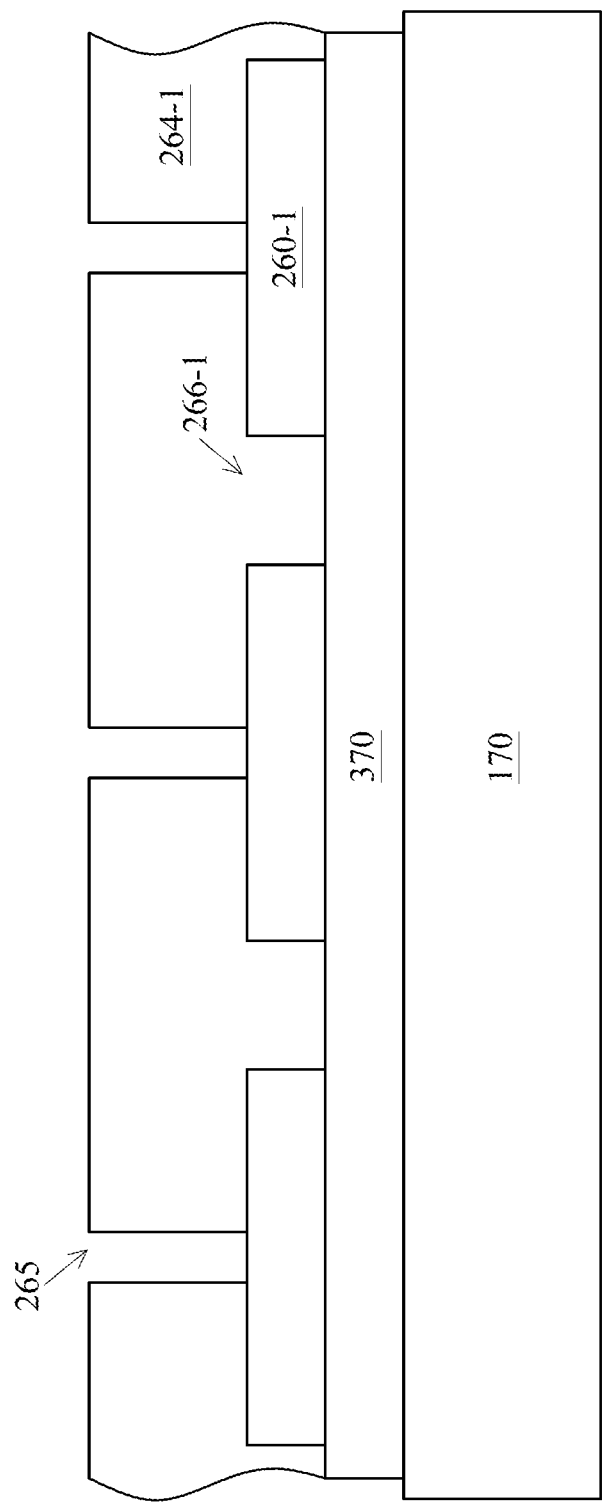

Referring to FIG. 14, a trench 265 is formed in the dielectric layer 264-1 and extends to the patterned conductive layer 260-1.

Figure 15:
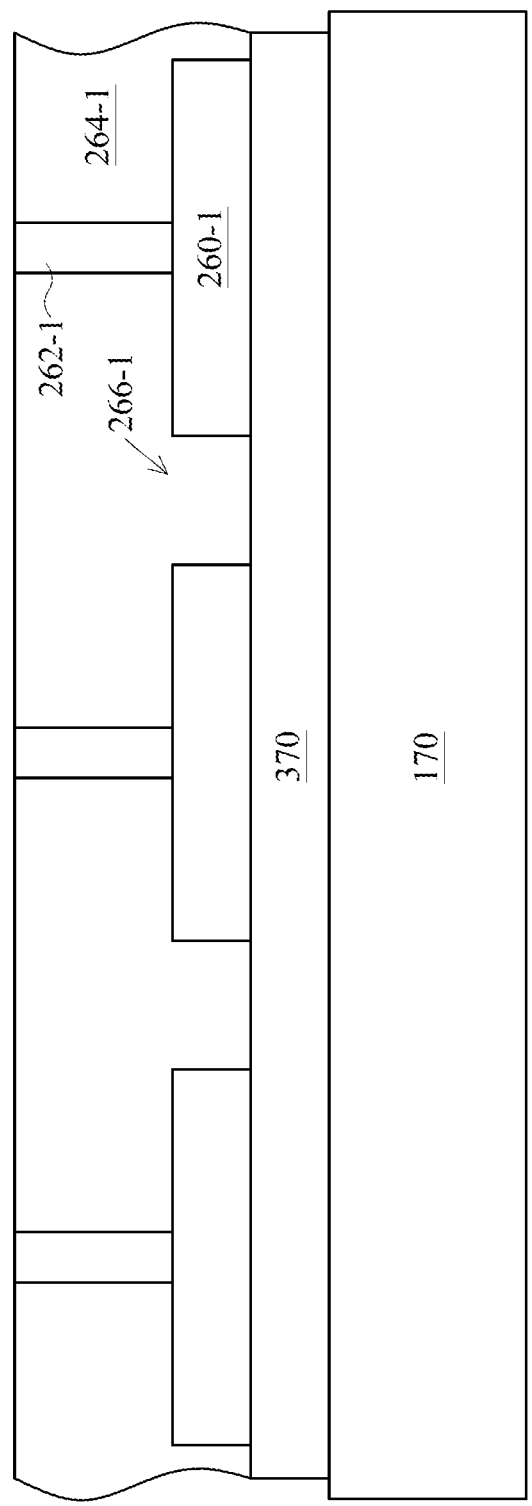

Referring to FIG. 15, a conductive via 262-1 is formed by filling conductive materials into the trench 265.

Figure 16:
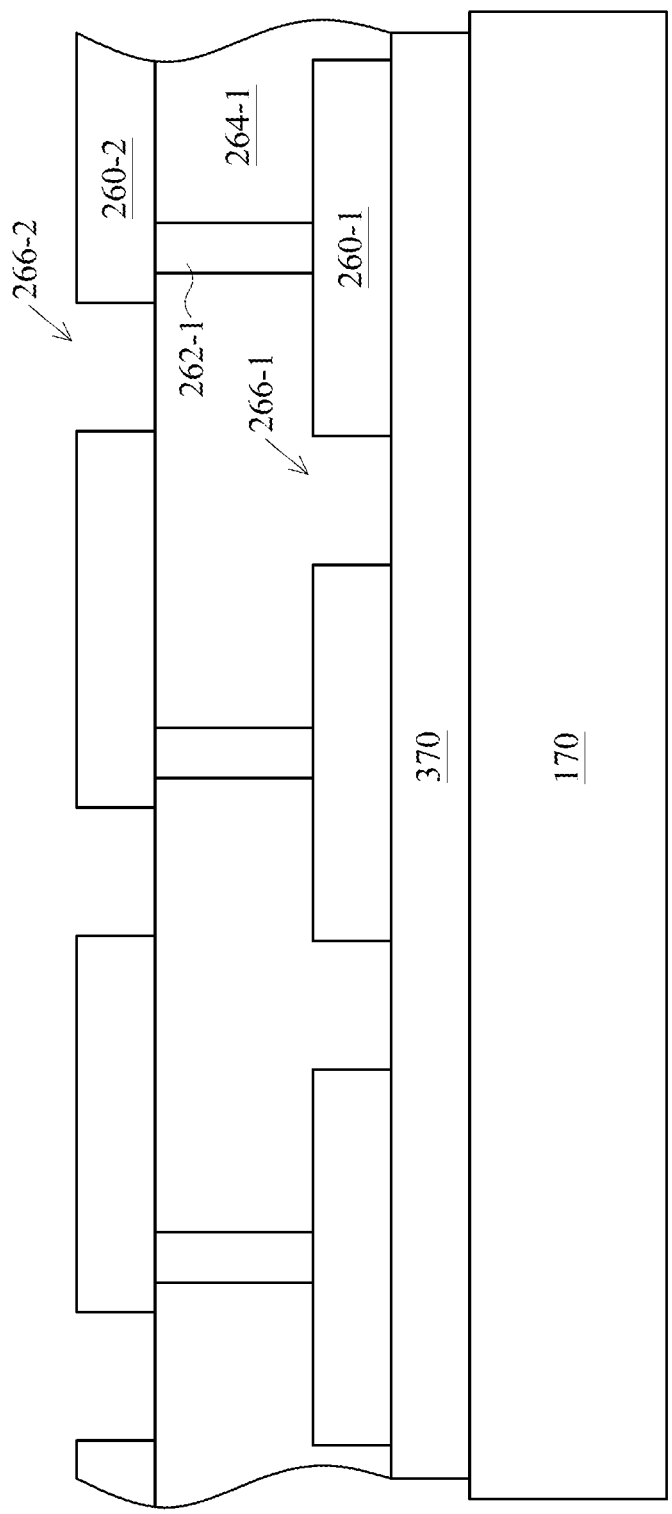

Referring to FIG. 16, a patterned conductive layer 260-2 having openings 266-2 is formed on the dielectric layer 264-1 and the conductive via 262-1 by, for example, a formation of a seed layer, physical vapor deposition (PVD), photolithography processes, electroplating or electroless plating, ashing or stripping processes, wet or dry etching, or any other suitable processes. Location of the opening 266-2 is offset from that of the opening 266-1 in the patterned conductive layer 260-1.

Figure 17:
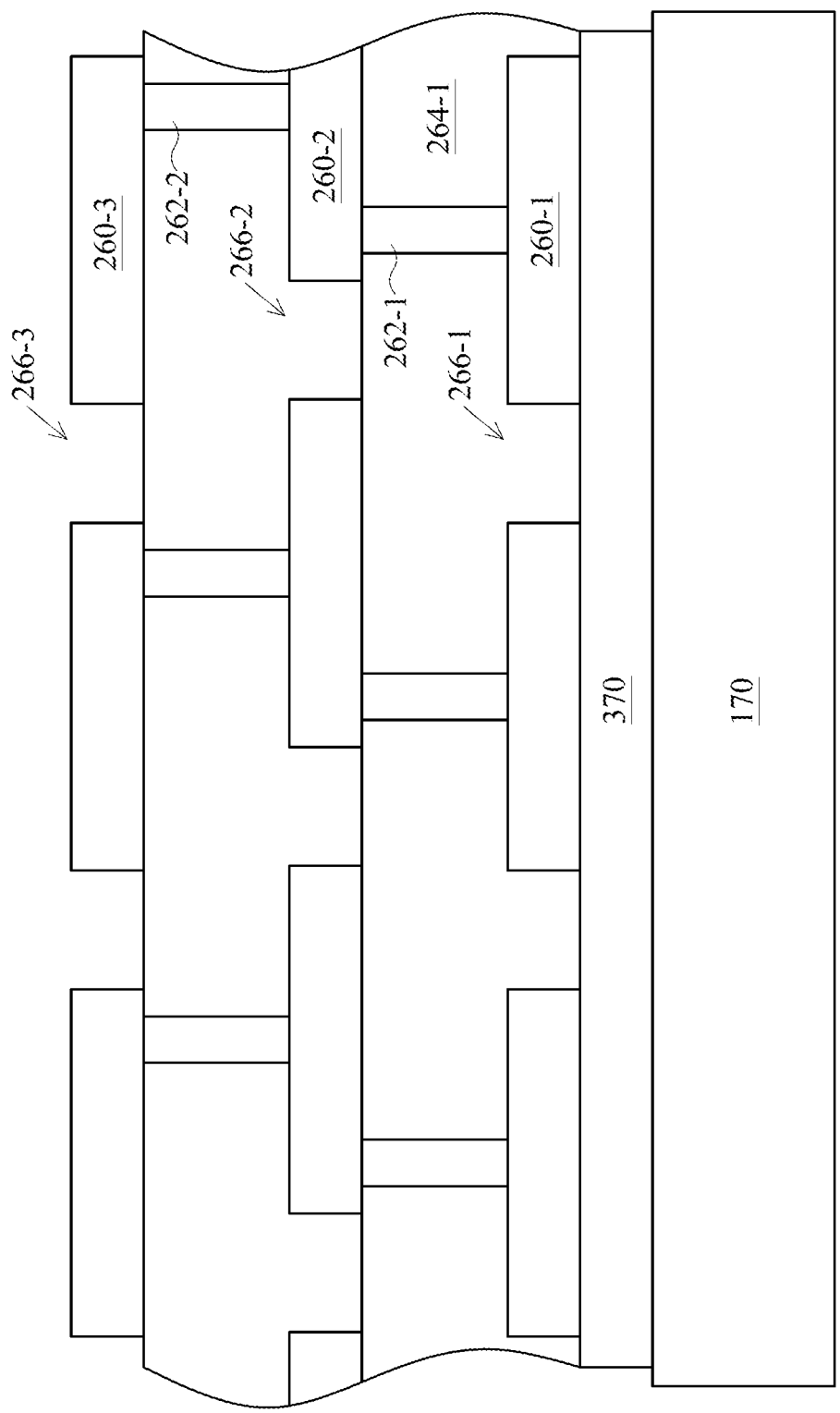

Referring to FIG. 17, repeating the similar process described above, a patterned conductive layer 260-3 having openings 260 is formed on a dielectric layer and a conductive via 262-2.

In the present disclosure, the seal ring 24-1, which is a seal ring closest to the die 22, forms an open loop. Consequently, the seal ring 24-1 is insensitive to a change in magnetic flux, caused by a signal transmitted by the die 22, through the seal ring 24-1. No induced current is generated. As a result, issues caused by an induced current are alleviated or eliminated.

One embodiment of the present disclosure provides a semiconductor device. The semiconductor device includes a semiconductor substrate, a die and a seal ring. The die is configured to be in and on the semiconductor substrate. The seal ring is configured to be on the semiconductor substrate and to be adjacent to the die. The seal ring forms an open loop.

Another embodiment of the present disclosure provides a semiconductor device. The semiconductor device includes a semiconductor substrate, a die and a seal ring. The die is configured to be in and on the semiconductor substrate, and to transmit a signal. The seal ring is configured to be on the semiconductor substrate, and to be adjacent to the die. The seal ring is insensitive to a change in magnetic flux, caused by the signal, through the seal ring.

The scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A semiconductor device, comprising:
a semiconductor substrate;
a die configured to be in and on the semiconductor substrate; and
a seal ring configured to be on the semiconductor substrate and to be adjacent to the die,
wherein the seal ring forms an open loop;
wherein the seal ring includes:
    a first conductive layer including an opening therein;
    a second conductive layer, over the first conductive layer, including an opening therein;
    wherein the second conductive layer and the opening of the second conductive layer are disposed on an uppermost surface of the semiconductor device.

2. The semiconductor device of claim 1,
wherein the opening of the second conductive layer exposes the opening of the first conductive layer.

3. The semiconductor device of claim 2, wherein the first conductive layer is in contact with the semiconductor substrate.

4. The semiconductor device of claim 2, further comprising:
a dielectric layer in contact with the semiconductor substrate,
wherein the first conductive layer is on the dielectric layer, and is electrically isolated from the semiconductor substrate by the dielectric layer.

5. The semiconductor device of claim 2, wherein the first conductive layer and the second conductive layer in combination are in a form of an open loop.

6. The semiconductor device of claim 1,
wherein the opening of the second conductive layer exposes a portion of the first conductive layer, and the second conductive layer overlaps the opening of the first conductive layer.

7. The semiconductor device of claim 6, wherein the first conductive layer is in contact with the semiconductor substrate.

8. The semiconductor device of claim 6, further comprising:
a dielectric layer in contact with the semiconductor substrate,
wherein the first conductive layer is on the dielectric layer, and is electrically isolated from the semiconductor substrate by the dielectric layer.

9. The semiconductor device of claim 1, wherein
the first conductive layer including:
    a first segment; and
    a second segment, and
the second conductive layer including:
    a first segment configured to be grouped with the first segment of the first conductive layer as a first group; and
    a second segment configured to be grouped with the second segment of the first conductive layer as a second group, and
wherein the first group is electrically isolated from and physically independent of the second group.

10. The semiconductor device of claim 9, wherein the first segment of the first conductive layer is coupled to the first segment of the second conductive layer, and the second segment of the first conductive layer is coupled to the second segment of the second conductive layer.

11. The semiconductor device of claim 1, wherein
the second conductive layer including:
    a first segment; and
    a second segment separate from the first segment;
a first via configured to connect the first segment to the first conductive layer; and
a second via configured to connect the first conductive layer to the second segment.

12. A semiconductor device, comprising:
a semiconductor substrate;
a die configured to be in and on the semiconductor substrate, and to transmit a signal; and
a seal ring configured to be on the semiconductor substrate, and adjacent to the die,
wherein the seal ring is insensitive to a change in magnetic flux, caused by the signal, through the seal ring;
wherein the seal ring includes:
    a first conductive layer including an opening therein;
    a second conductive layer, over the first conductive layer, including an opening therein;
    wherein the second conductive layer and the opening of the second conductive layer are disposed on an uppermost surface of the semiconductor device.

13. The semiconductor device of claim 12, wherein the seal ring includes:
a first seal ring in a first conductive layer, and
a second seal ring in a second conductive layer,
wherein the first seal ring is coupled to the second seal ring, and
wherein the first seal ring and the second seal ring in combination are insensitive to the change in magnetic flux.

14. The semiconductor device of claim 12,
wherein the opening of the second conductive layer exposes the opening of the first conductive layer.

15. The semiconductor device of claim 14, wherein the first conductive layer is in contact with the semiconductor substrate.

16. The semiconductor device of claim 14, further comprising:
a dielectric layer in contact with the semiconductor substrate, wherein the first conductive layer is on the dielectric layer, and electrically isolated from the semiconductor substrate by the dielectric layer.

17. The semiconductor device of claim 14, wherein the first conductive layer serves as an etching-stop layer.

18. The semiconductor device of claim 14, wherein the first conductive layer and the second conductive layer in combination form an open loop.

19. The semiconductor device of claim 12,
wherein the opening of the second conductive layer exposes a portion of the first conductive layer, and the second conductive layer overlaps the opening of the first conductive layer.

20. The semiconductor device of claim 19, wherein the first conductive layer is in contact with the semiconductor substrate.

* * * * *